(12) United States Patent
Zhang et al.

(10) Patent No.: US 12,231,086 B2
(45) Date of Patent: Feb. 18, 2025

(54) SWITCH CIRCUIT AND PROGRAMMABLE CONNECTION CHIP

(71) Applicant: INDUSTRIAL TECHNOLOGY RESEARCH INSTITUTE, Hsinchu (TW)

(72) Inventors: Jie Zhang, New Taipei (TW); Sih-Han Li, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 121 days.

(21) Appl. No.: 18/097,933

(22) Filed: Jan. 17, 2023

(65) Prior Publication Data

US 2024/0186949 A1 Jun. 6, 2024

(30) Foreign Application Priority Data

Dec. 5, 2022 (TW) .................................. 111146556

(51) Int. Cl.
H03D 7/14 (2006.01)
(52) U.S. Cl.
CPC ......... *H03D 7/1458* (2013.01); *H03D 7/1441* (2013.01)
(58) Field of Classification Search
CPC ....... G11C 11/412; G11C 11/41; G11C 11/40; G11C 11/34; G11C 11/21; G11C 11/00; G11C 7/10; H03D 7/1441; H03D 7/1458; H03D 7/1466; H03D 7/1425; H03D 7/14; H03D 7/00; H03K 2217/0018; H03K 2217/0054; H03K 2217/00;
(Continued)

(56) References Cited

U.S. PATENT DOCUMENTS

| 5,880,620 A | 3/1999 | Gitlin et al. |
| 6,492,860 B1 | 12/2002 | Ramakrishnan |

(Continued)

FOREIGN PATENT DOCUMENTS

| CN | 111865278 A | 10/2020 |
| TW | I540834 B | 7/2016 |

(Continued)

OTHER PUBLICATIONS

TW Office Action dated Jul. 20, 2023 as received in Application No. 111146556.

(Continued)

*Primary Examiner* — Diana J. Cheng
(74) *Attorney, Agent, or Firm* — Maschoff Brennan (57) ABSTRACT

A switching circuit includes a transmission gate, two base control sub-circuits each including a first transistor and a second transistor, a third transistor, and a fourth transistor. The transmission gate includes two I/O terminals, two gate control terminals, and two base control terminals, and is configured to conduct or not conduct the two I/O terminals according to the voltage of the two gate control terminals. The two base voltage control sub-circuits, the third transistor and the fourth transistor forms a double balance circuit structure and is electrically connected to the transmission gate. The double balance circuit changes the voltage of the base control terminals according to the voltage of the I/O terminals of the transmission gate.

4 Claims, 3 Drawing Sheets

(58) Field of Classification Search
CPC ........... H03K 17/6874; H03K 17/6871; H03K 17/687; H03K 17/56
See application file for complete search history.

(56) References Cited

U.S. PATENT DOCUMENTS

| | | | |
|---|---|---|---|
| 7,728,649 B1 * | 6/2010 | Webb | H03K 17/165 |
| | | | 327/404 |
| 7,924,085 B2 | 4/2011 | Guo | |
| 8,228,109 B2 | 7/2012 | Stockinger et al. | |
| 8,570,096 B2 | 10/2013 | Le Coz et al. | |
| 8,581,656 B2 | 11/2013 | Curatolo | |
| 9,214,932 B2 | 12/2015 | Clausen et al. | |
| 10,141,926 B2 * | 11/2018 | Frankel | H03K 17/6872 |
| 10,978,995 B2 | 4/2021 | Itasaka et al. | |
| 2015/0381171 A1 | 12/2015 | Cebi et al. | |
| 2017/0272066 A1 | 9/2017 | Scott et al. | |
| 2020/0244165 A1 | 7/2020 | Chen et al. | |
| 2020/0343892 A1 | 10/2020 | Yang et al. | |
| 2022/0359512 A1 | 11/2022 | Peng et al. | |

FOREIGN PATENT DOCUMENTS

| | | |
|---|---|---|
| TW | 202029648 A | 8/2020 |
| TW | 202238823 A | 10/2022 |

OTHER PUBLICATIONS

Reszewicz et al. "2.4 GHz LC-VCO with improved robustness against PVT using FD-SOI body biasing technique" Apr. 2018 IEEE 21st International Symposium on Design and Diagnostics of Electronic Circuits & Systems (DDECS).

Wang et al. "A 0.65 mW 2.3-2.5GHz low phase noise LC-VCO with adaptive body biasing technique" International Symposium on Radio-Frequency Integration Technology, Nov. 30-Dec. 2, 2011.

Iijima et al. "A Technique for High-Speed Circuits on SOI Using Look-Ahead Type Active Body Bias Control" May 2004 IEEE International Symposium on Circuits and Systems (ISCAS).

Hisu et al. "Compact Layout of DT-MOS Transistor With Source-Follower Subcircuit in 90-nm CMOS Technology" IEEE Electron Device Letters ( vol. 29, Issue: 4, Apr. 2008).

Lai et al. "Low Power Class-C VCO Using Dynamic Body Biasing" 2017 6th International Symposium on Next Generation Electronics (ISNE).

* cited by examiner

SWITCH CIRCUIT AND PROGRAMMABLE CONNECTION CHIP

CROSS-REFERENCE TO RELATED APPLICATIONS

This non-provisional application claims priority under 35 U.S.C. § 119(a) on Patent Application No(s). 111146556 filed in Taiwan (R.O.C) on Dec. 5, 2022, the entire contents of which are hereby incorporated by reference.

BACKGROUND

1. Technical Field

This disclosure relates to a switch circuit, and particularly to a switch circuit in the form of a transmission gate.

2. Related Art

A transmission gate is a controllable switch that can transmit a digital signal and an analog signal. A transmission gate is usually composed of an N-channel metal oxide semiconductor field effect transistor and a P-channel metal oxide semiconductor field effect transistor. Generally, the base voltage of the transistor of the transmission gate is a working voltage or ground voltage, and when it is turned on, the on-state resistance will rise due to the variance of the base voltage and the signal voltage, which will further influence the transmission efficiency.

SUMMARY

A switch circuit according to an embodiment of the present disclosure includes a transmission gate, two base control sub-circuits each including a first transistor and a second transistor, a third transistor and a fourth the transistor, wherein the transmission gate includes two input/output (I/O) terminals, two gate control terminals, and two base control terminals, and is configured to make the two I/O terminals conduct or not conduct with each other according to voltages of the two gate control terminals. The first transistor of each of the base control sub-circuit has a first terminal electrically connected to a first one of the two I/O terminals, a second terminal electrically connected to a first node, and a control terminal electrically connected a second node, the second transistor of each of the base control sub-circuits has a first terminal electrically connected to the first node, a second terminal electrically connected to a second one of the two I/O terminals, and a control terminal electrically connected to the second node. The third transistor has a first terminal electrically connected to a first one of the two base control terminals, a second terminal which is grounded, and a control terminal electrically connected a first one of the two gate control terminals. The fourth transistor has a first terminal configured to receive a working voltage, a second terminal electrically connected to a second one of the two base control terminals, and a control terminal electrically connected to a second one of the two gate control terminals, wherein the first node and the second node corresponding to one of the two base control sub-circuits are the first one of the two base control terminals and the second one of the two gate control terminals, respectively, and the first node and the second node of the other one of the two base control sub-circuits are the second one of the two base control terminals and the first one of the two gate control terminals, respectively.

A programmable connection chip according to an embodiment of the present disclosure includes a plurality of conductive pads and a switch control circuit. The plurality of conductive pads arranged in a conductive pad array, wherein each of the plurality of conductive pads comprised in the conductive pad array has a row position and a column position, a row signal switch is provided between two adjacent conductive pads corresponding to the same row position, and a column signal switch is provided between two adjacent conductive pads corresponding to the same column position, wherein at least one of the row signal switch and column signal switch includes the switch circuit mentioned above, and the tow I/O terminals of the switch circuits are connected to the two adjacent conductive pads, respectively. The switch control electrically circuit to the two gate control terminals of the switch circuit.

BRIEF DESCRIPTION OF THE DRAWINGS

The present disclosure will become more fully understood from the detailed description given hereinafter and the accompanying drawings which are given by way of illustration only and thus are not limitative of the present disclosure and wherein:

FIG. 4a and FIG. 4b are resistance-voltage data comparison figures of the switch circuit disclosed in an embodiment of the present disclosure and another switch circuit;

FIG. 4c is a voltage-time data comparison figure of the switch circuit disclosed in an embodiment of the present disclosure and another switch circuit;

FIG. 5 is a schematic diagram illustrating the programmable connection chip according to an embodiment of the present disclosure; and FIG. 6 is a schematic diagram illustrating a system package to which the programmable connection chip is applicable according to an embodiment of the present disclosure.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention.

Figure 1:
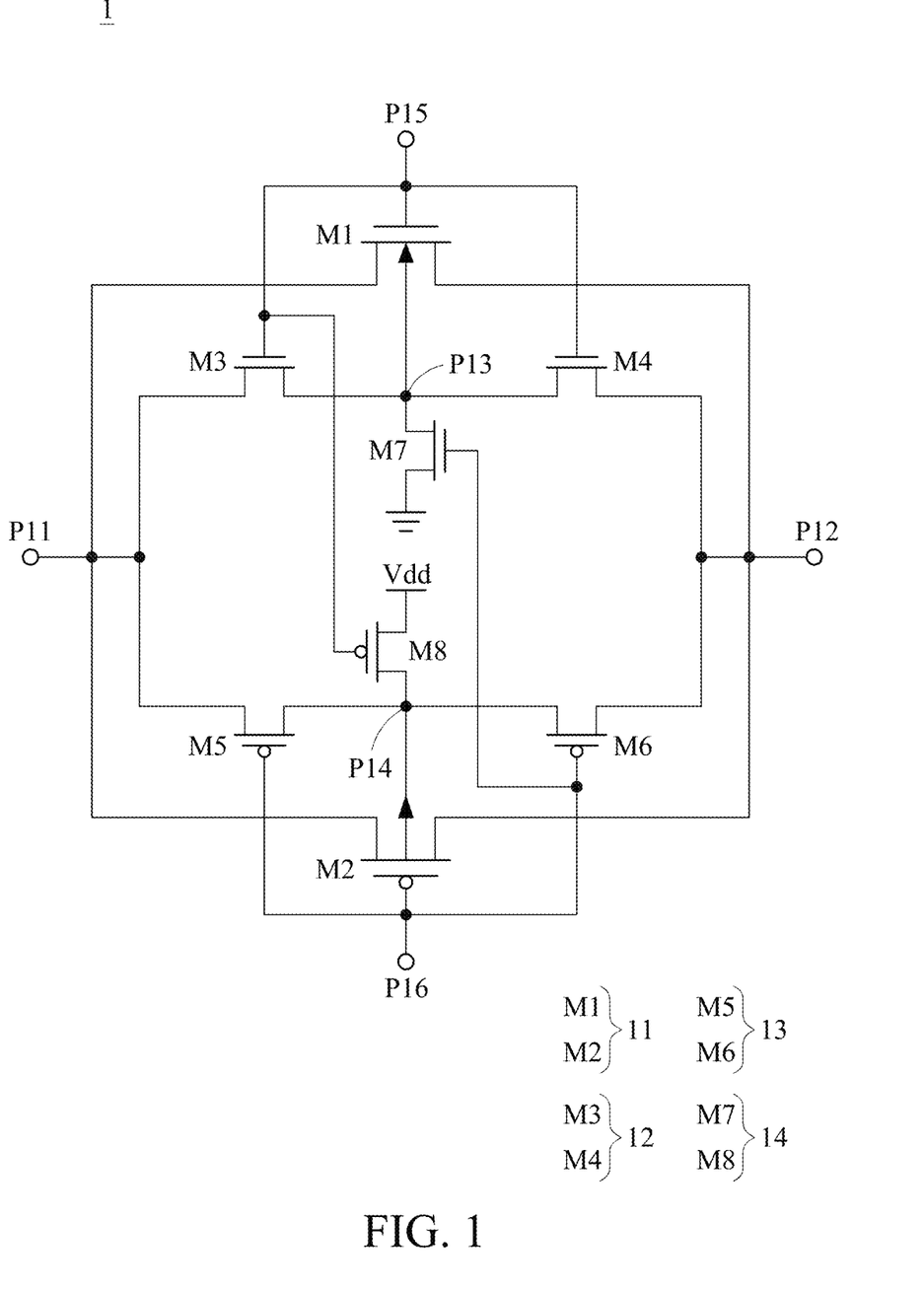
FIG. 1 is a circuit diagram illustrating the switch circuit according to an embodiment of the present disclosure.

Please refer to FIG. 1 which is a circuit diagram illustrating the switch circuit according to an embodiment of the present disclosure. As shown in FIG. 1, the switch circuit 1 includes a transmission gate 11, two base control sub-circuits 12 and 13, and transistor group 14.

The transmission gate 11 includes transistors M1 and M2, has two input/output (I/O) terminals P11 and P12, two base control terminal P13 and P14 and two gate control terminals P15 and P16, and is configured to make the two I/O terminals P11 and P12 conduct or not conduct with each other according to voltages of the two gate control terminals P15 and P16. Particularly, the source of the transistor M1 and the drain of the transistor M2 are connected to each other as the I/O terminal P11, the drain of the transistor M1 and the source of the transistor M2 are connected to each other as the I/O terminal P12.

The base control sub-circuit 12 includes a transistor M3 and a transistor M4. The first terminal of the transistor M3 is electrically connected to the I/O terminal P11, the second terminal of the transistor M3 is electrically connected the base control terminal P13, and the control terminal of the transistor M3 is electrically connected to the gate control terminal P15. The first terminal of the transistor M4 is electrically connected to the base control terminal P13, the second terminal of the transistor M4 is electrically connected the I/O terminal P12, and the control terminal of transistor M4 is electrically connected to the gate control terminal P15. The base control sub-circuit 13 includes transistors M5 and M6. The first terminal of the transistor M5 is electrically connected to the I/O terminal P11, the second terminal of the transistor M5 is electrically connected the base control terminal P14, and the control terminal of the transistor M5 is electrically connected to the gate control terminal P16. The first terminal of the transistor M6 is electrically connected to the base control terminal P14, the second terminal of the transistor M6 is electrically connected the I/O terminal P14, and the control terminal of the transistor M6 is electrically connected to the gate control terminal P16.

The transistor group 14 includes transistors M7 and M8. The first terminal of the transistor M7 is electrically connected the base control terminal P13, the second terminal of the transistor M7 is configured to receive a ground voltage, and the control terminal of the transistor M7 is electrically connected to the gate control terminal P16. The first terminal of the transistor M8 is configured to receive the working voltage Vdd, the second terminal of the transistor M8 is electrically connected the base control terminal P14, and the control terminal of the transistor M8 is electrically connected to the gate control terminal P15.

With the circuit structure above, the two base control sub-circuits 12 and 13 and the transistor group 14 may dynamically adjust the base voltages of the two transistors M1 and M2 according to the on/off state of the transmission gate 11. Moreover, the dynamic adjustment operation may include: when the transmission gate 11 is in on state, the two base control sub-circuits 12 and 13 and the transistor group 14 synchronize the base voltages of the transistors M1 and M2 with the voltage of the input signal (smaller than a default value, or even equal 0). As shown in the formula of threshold voltage of transistors (1), when the source voltage is higher than the base voltage for the voltage difference Vsb to be positive, the threshold voltage Vth may rise; as shown in the formula of current of transistors (2), when the threshold voltage rises, the drain current Id may fall, and at this moment, the drain voltage Vd remain the same, and the switch on-state resistance Ron may increase. That is, when a general transmission gates is in on state, a problem of increase in the switch on-state resistance may occurs due to the difference between the base voltage and the input signal voltage.

$$V_{th} = V_{t0} + r(\sqrt{|-2\varphi_f + V_{sb}|} - \sqrt{|2\varphi_f|}) \quad (1)$$

$$I_d = \frac{1}{2}\mu_n C_{ox}\left(\frac{W}{L}\right)(V_{gs} - V_{th})^2 = \frac{V_d}{R_{on}} \quad (2)$$

In contrast, the switch circuit 1 of the present embodiment may reduce the rising amount of the threshold voltage Vth or prevent the rising of threshold voltage Vth by the structure which synchronizes the base voltage with the voltage of the input signal mentioned above, thereby having a lower switch on-state resistance Ron. Moreover, and it can be known through the formula of time constant (3) below that when the switch on-state resistance lowers, the charging speed and discharging speed of the transistor increases, and further increases the channel bandwidth. That is, the switch circuit 1 of the present embodiment may solve the problem of increase in the switch on-state resistance caused by the difference between the base voltage and the input signal voltage when the general transmission gate is in on state, and accordingly, the switch circuit 1 may have a lower switch on-state resistance, and further have a wider channel bandwidth.

$$\tau = RC \quad (3)$$

Additionally, when the transmission gate 11 is in off state, the two base control sub-circuits 12 and 13 and the transistor group 14 adjust the base voltages of transistors M1 and M2 of the transmission gate 11 to the working voltage Vdd and the ground voltage, respectively, thereby preventing the problem of current leakage at the base end. Moreover, the area occupied by the wires of the switch circuit 1 may be similar to that of the general transmission gate. That is, the switch circuit 1 is better than the general transmission gate in characteristics and its occupied area is equivalent to that of the general transmission gate, and therefore has advantage in comparison.

Also, the two base control sub-circuits 12 and 13 and the transistor group 14 of the switch circuit 1 in the present embodiment may constitute a circuit structure of which two terminals are balanced, so that no matter if the switch circuit 1 performs the transmission in a normal direction (for example, from the I/O terminal P11 to the I/O terminal P12) or in an opposite direction (for example, from the I/O terminal P12 to the I/O terminal P11), the switch circuit 1 may have the same resistance value.

The circuit structure of the two base control sub-circuits 12 and 13 of the switch circuit 1 mentioned above may be regarded as the two base control structures each including a first transistor and a second transistor, and the circuit structure of the transistor group 14 may be regarded as including a third transistor and a fourth transistor. The electrical connection relationship of each of the base control circuits 12/13 and the transmission gate 11 may be regarded as: the first transistor having a first terminal electrically connected to a first one of the two I/O terminals, a second terminal electrically connected to a first node, and a control terminal electrically connected to a second node; the second transistor having a first terminal electrically connected to the first node, a second terminal electrically connected to a second one of the two I/O terminals and a control terminal electrically connected to the second node; wherein the first node and the second node corresponding to one of the two base control sub-circuits are the first one of the two base control terminals and the second one of the two gate control terminals, respectively, and the first node and the second node of the other one of the two base control sub-circuits are the second one of the two base control terminals and the first one of the two gate control terminals, respectively. The electrical connection relationship of the transistor group 14 and the transmission gate 11 may be regarded as: a third transistor having a first terminal electrically connected to a first one of the two base control terminals, a second terminal which is grounded, and a control terminal electrically connected to a first one of the two gate control terminals; a fourth transistor having a first terminal configured to receive a working voltage, a second terminal electrically connected to a second one of the two base control terminals and a control terminal electrically connected a second one of the two gate control terminals.

Figure 2:
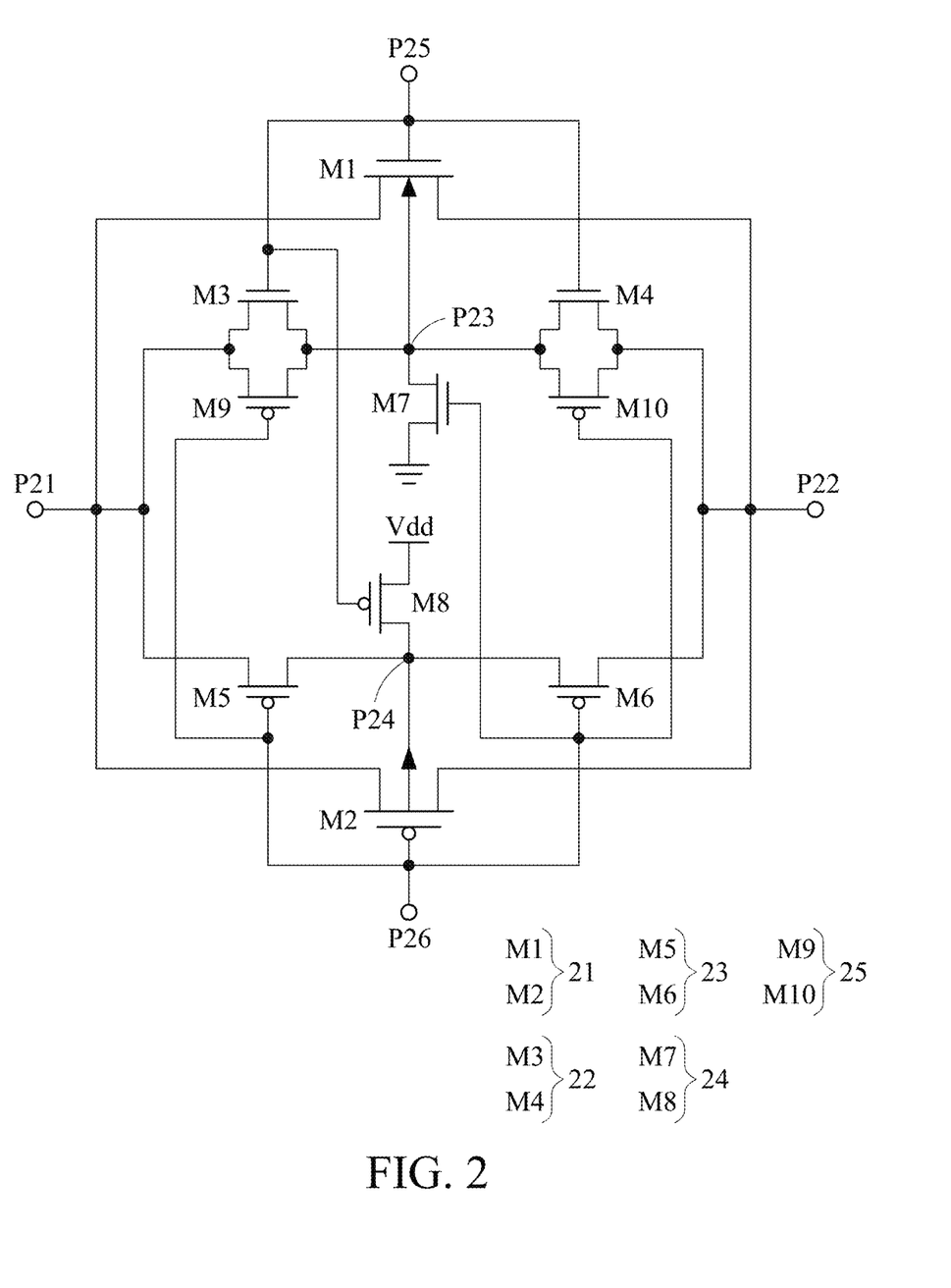
FIG. 2 is a circuit diagram illustrating the switch circuit according to another embodiment of the present disclosure.

Please refer to FIG. 2, which is a circuit diagram illustrating the switch circuit according to another embodiment of the present disclosure. As shown in FIG. 2, the switch circuit 2 includes a transmission gate 21, base control sub-circuits 22 and 23, a first transistor group 24 and a second transistor group 25, wherein the electrical connection of the transmission gate 21, the base control sub-circuits 22 and 23 and the first transistor group 24 are the same as that of the transmission gate 21, the base control sub-circuits 12 and 13 and the transistor group 14 shown in FIG. 1, which is not repeated here.

The second transistor group 25 includes transistors M9 and M10. The first terminal of the transistor M9 is electrically connected to the first terminal of the transistor M3, a second terminal of the transistor M9 is electrically connected to the second terminal of the transistor M3, and the control terminal of the transistor M9 is electrically connected to the control terminal of the transistor M5. The first terminal of the transistor M10 is electrically connected the first terminal of the transistor M4, the second terminal of transistor M10 is electrically connected the second terminal of the transistor M4, and the control terminal of the transistor M10 is electrically connected to the control terminal of the transistor M6.

In a variation of the present embodiment, the transistors M9 and M10 of the second transistor group 25 may alternatively be connected to the transistors M5 and M6. Particularly, the first terminal of the transistor M9 is electrically connected the first terminal of the transistor M5, the second terminal of the transistor M9 is electrically connected to the second terminal of the transistor M5, and the control terminal of the transistor M9 is electrically connected the control terminal of the transistor M3. The first terminal of the transistor M10 is electrically connected the first terminal of the transistor M6, the second terminal of the transistor M10 is electrically connected to the second terminal of the transistor M6, and the control terminal of the transistor M10 is electrically connected the control terminal of the transistor M4, wherein the type of the transistors M9 and M10 in the present variation embodiment may be different from the type of transistors M9 and M10 of the embodiment shown in FIG. 2. Particularly, in the embodiment shown in FIG. 2, the transistors M9 and M10 may be P-type transistors, and in the variation embodiment, the transistors M9 and M10 may be N-type transistors.

In the embodiment including the second transistor group mentioned above, the switch circuit 2 may also perform the dynamic adjustment operation processed by the switch circuit 1 mentioned above, thereby solving the problem of increase in the switch on-state resistance may occur due to the difference between the base voltage and the input signal voltage when the general transmission gate is in on state, and accordingly, the switch circuit 2 may have a lower switch on-state resistance and further have a wider channel bandwidth. The switch circuit 2 may also perform as mentioned above when the transmission gate 21 is in the off state, the two base control circuits 22 and 23, the first transistor group 24 and the second transistor group 25 adjust the base voltage of transistors M1 and M2 of the transmission gate 21 to the working voltage Vdd and the ground voltage, thereby preventing the problem of current leaking at the base end. Moreover, the base control sub-circuits 22 and 23 of the switch circuit 2, the first transistor group 24 and the second transistor group 25 may constitute a circuit structure of which two terminals are balanced, so that no matter if the switch circuit 2 performs the transmission in a normal direction (for example, from the I/O terminal P21 to the I/O terminal P22) or in an opposite direction (for example, from the I/O terminal P22 to the I/O terminal P21), the switch circuit 2 may have the same resistance value. Also, in comparison with the switch circuit 1 shown in FIG. 1, the switch circuit 2 may have a lower on-state resistance, and further have a faster charging and discharging speed and a wider channel bandwidth.

The circuit structure of the switch circuit 2 mentioned above may be regarded as the switch circuit 1 shown in FIG. 1 further including a fifth transistor and a sixth transistor, wherein the first terminal of the fifth transistor is electrically connected the first terminal of the first transistor of the first one of the two base control sub-circuits mentioned above, the second terminal of the fifth transistor is electrically connected to the second terminal of the first transistor of the two base control sub-circuits mentioned above, and the control terminal of the fifth transistor is electrically connected the control terminal of the first transistor of the second one of the two base control sub-circuits, the first terminal of the sixth transistor is electrically connected to the first terminal of the second transistor of the first one of the two base control sub-circuits mentioned above, the second terminal of the sixth transistor is electrically connected to the second terminal of the second transistor of the first one of the two base control sub-circuits, and the control terminal of the sixth transistor is electrically connected the control terminal of the second transistor of the second one of the two base control circuits mentioned above.

Figure 3:
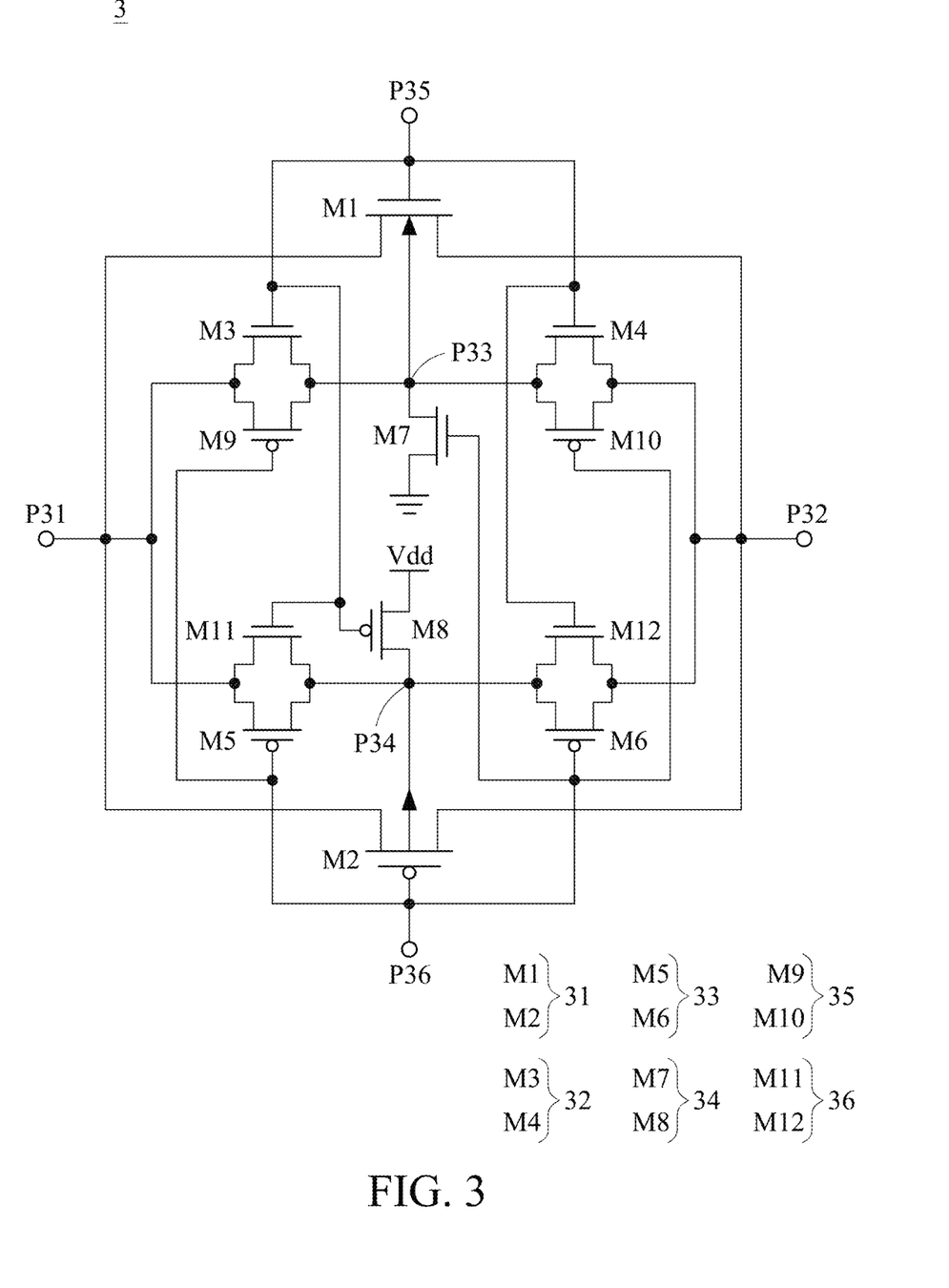
FIG. 3 is a circuit diagram illustrating the switch circuit according to yet another embodiment of the present disclosure.

Please refer to FIG. 3, which is a circuit diagram illustrating the switch circuit according to yet another embodiment of the present disclosure. As show in FIG. 3, the switch circuit 3 includes a transmission gate 31, base control sub-circuits 32 and 33, a first transistor group 34, a second transistor group 35, and a third transistor group 36, wherein the way of connection and structure of the transmission gate 31, the base control sub-circuits 32 and 33, the first transistor group 34, and the second transistor group 35 may be the same as those of the transmission gate 21, the base control sub-circuits 22 and 23, the first transistor group 24 and the second transistor group 25 of the switch circuit 2 shown in FIG. 2, which will not be repeated here.

The third transistor group 36 includes the transistors M11 and M12. The first terminal of the transistor M11 may be electrically connected to the first terminal of the transistor M5, the second terminal of the transistor M11 may be connected to the second terminal of the transistor M5, and the control terminal of the transistor M11 may be electrically connected to the control terminal of the transistor M3. The first terminal of the transistor M12 may be electrically connected to the first terminal of the transistor M6, the second terminal of the transistor M12 may be electrically connected the second terminal of the transistor M6, and the control terminal of the transistor M12 may be electrically connected to the control terminal of the transistor M4. That is, the first terminal of the transistor M11 is electrically connected to the I/O terminal P31, the second terminal of the transistor M11 is electrically connected to the base control terminal P34, and the control terminal of the transistor M11 is electrically connected to the gate control terminal P35. The first terminal of the transistor M12 is electrically connected to the gate control terminal P34, the second terminal of the transistor M12 is electrically connected the I/O terminal P32, and the control terminal of the transistor M12 is electrically connected to the gate control terminal P35.

In the embodiment including the third transistor group mentioned above, the switch circuit 3 may also perform the dynamic adjustment operation processed by the switch circuit 1 mentioned above, thereby solving the problem of increase in the switch on-state resistance may occur due to the difference between the base voltage and the input signal voltage, and accordingly, the switch circuit 3 may have a lower switch on-state resistance and further have a wider channel bandwidth. The switch circuit 3 may also perform the operation as mentioned above when the transmission gate 31 is in the off state, the base control sub-circuits 32 and 33, the first transistor group 34, the second transistor group 35, and the third transistor group 36 adjust the base voltage of the transistors M1 and M2 of the transmission gate 31 to the working voltage Vdd and the ground voltage, thereby preventing the problem of current leaking at the base end. Moreover, the base control sub-circuits 32 and 33 of the switch circuit 3, the first transistor group 34 and the second transistor group 35 may constitute a circuit structure of which two terminals are balanced, so that no matter if the switch circuit 3 performs transmission in a normal direction (for example, from the I/O terminal P31 to the I/O terminal P32) or in an opposite direction (for example, from the I/O terminal P32 to the I/O terminal P31), the switch circuit 3 may the same resistance value. Also, in comparison with the switch circuit 2 shown in FIG. 2, the switch circuit 3 may have a lower on-state resistance, and further have a faster charging and discharging speed and a wider channel bandwidth.

The circuit structure of the switch circuit 3 mentioned above may be regarded as the switch circuit 2 shown in FIG. 2 further including a seventh transistor and an eighth transistor, wherein the first terminal of the seventh transistor is electrically connected the first terminal of the first transistor of the second one of the two base control sub-circuits mentioned above, the second terminal of the seventh transistor is electrically connected to the second terminal of the first transistor of the second one of the two base control sub-circuits, and the control terminal of the seventh transistor is electrically connected to the control terminal of the first transistor of the first one of the two base control sub-circuits, the first terminal of the eighth transistor is electrically connected to the first terminal of the second transistor of the second one of the two base control sub-circuits, the second terminal of the eighth transistor is electrically connected to the second terminal of the second transistor of the second one of the two base control sub-circuits, and the control terminal of the eighth transistor is electrically connected to the control terminal of the second transistor of the first one of the two base control sub-circuits.

It should be noted that in the above embodiments, each of the transistors M1, M3, M4, M7, M11, and M12 in the switch circuit is implemented by a N-channel metal-oxide-semiconductor field-effect transistor (MOSFET), and each of the transistors M2, M5, M6, M8, M9, and M10 in the switch circuit is implemented by a P-channel MOSFET. However, the present disclosure is not limited by thereof.

Please refer to FIG. 4a to FIG. 4c, wherein FIGS. 4a and 4c are comparison figures of data obtained by measuring the switch circuit 3 shown in FIG. 3 and a general transmission gate switch circuit, FIG. 4b is a comparison figure of data obtained by measuring the switch circuit 3 shown in FIG. 3 and a non-balanced transmission gate switch circuit.

FIG. 4a is a resistance-voltage data comparison figure of the switch circuit 3 and the general transmission gate switch circuit, wherein the data R2 is the measured data of the resistance of the switch circuit 3 and the data R1 is the measured data of the resistance of the general transmission gate switch circuit. It can be known by FIG. 4a that the on-state resistance of the switch circuit 3 is far smaller than the on-state resistance of the general gate transmission circuit; that is, the conduction performance is better than the general transmission gate circuit.

FIG. 4b is a comparison figure of resistance-voltage data of the switch circuit 3 and the non-balance transmission gate switch circuit (for example, a circuit formed by removing transistors M3, M5, M9, and M11 from the switch circuit 3), wherein the data R3 and R4 are measured data of the resistance of the switch circuit 3 shown in FIG. 3, the data R3 shows the resistance measured when the switch circuit 3 is conducted in a normal direction (for example, the conducting direction is from P31 to P32), and the data R4 shows the resistance measured when the switch circuit 3 is conducted in an opposite direction (for example, the conducting direction is from P32 to P31). The data R5 shows the resistance measured when the non-balanced transmission gate circuit is conducted in the opposite direction and the data R6 shows the resistance measured when the non-balanced transmission gate circuit is conducted in a normal direction. It can be known from FIG. 4b that comparing with the non-balanced transmission gate circuit, the switch circuit 3 have uniform on-state resistance during bidirectional conduction, so it may be used more flexible.

FIG. 4c is a comparison figure of voltage-time data of the switch circuit 3 and the general transmission gate circuit. The data V2 shows the measured voltage of the switch circuit 3 of the present disclosure and the data V1 shows the measured voltage of the general transmission gate circuit. As shown in FIG. 4c, comparing to the data V1, the data V2 has a slope with the higher steep. In other words, the speed of the data V2 rising or falling to a certain voltage is faster than the data V1, and that is, the switch circuit 3 has a faster response speed than the general transmission gate circuit.

Although FIGS. 4a to 4c merely presents the data comparison between the switch circuit 3 shown in FIG. 3 and the general transmission circuit/non-balanced transmission gate circuit, those who are skilled in art of the present disclosure may understand that the switch circuit 1 shown in FIG. 1 and the switch circuit 2 shown in FIG. 2 may also have similar comparison results with the general transmission gate circuit/non-balanced transmission gate switch circuit according to the structures of the switch circuit 1 and the switch circuit 2.

Please refer to FIG. 5, which is a schematic diagram illustrating the programmable connection chip according to an embodiment of the present disclosure. As shown in FIG. 5, the programmable connection chip C1 may include a plurality of conductive pads PA1 to PA4 and a switch control circuit SC. The conductive pads PA1 to PA4 are arranged in a conductive pad array. Each of the conductive pads PA1 to PA4 in the conductive pad array has a row position and a column position. A row signal switch SW1 is provided between the two adjacent conductive pads PA1 and PA2 corresponding to the same row position, a row signal switch SW3 is provided between the two adjacent conductive pads PA3 and PA4 corresponding to the same row position, a column signal switch SW2 is provided between the two adjacent conductive pads PA1 and PA3 corresponding to the same column position, and a column signal switch SW4 is set between the two adjacent conductive pads PA2 and PA4 corresponding to the same column position. At least one of the row signal switches SW1 and SW3 and the column signal switches SW2 and SW4 may include any one of the switch circuits 1 to 3 as shown in FIG. 1 to FIG. 3, and the two I/O terminals of the switch circuit connects to two adjacent conductive pads, respectively. The switch control circuit SC is electrically connected to each of the control terminals of the signal switches SW1 to SW4. For the signal switch including any one of the switch circuits 1 to 3 shown in FIG. 1 to FIG. 3, the switch control circuit SC is electrically connected to the two gate control terminals of the switch circuit.

The switch control circuit SC of the programmable connection chip C1 may input a gate control signal to any one of the signal switches SW1 to SW4. Using the row signal switch SW1 as an example, when the gate control signal received by the row signal switch SW1 is an off signal, the row signal switch is turned off, so that the two adjacent conductive pads PA1 and PA2 are not electrically connected with each other; when the gate control signal received by the row signal switch SW1 is an on signal, the row signal switch is turned on, so that the adjacent conductive pads PA1 and PA2 are electrically connected with each other. The remaining signal switches SW2 to SW4 operate with the same way as mentioned above, so the details are not repeated.

It can be known by the description above that the programmable connection chip C1 may control the connection state between the conductive pads PA1 to PA4 by adding any one of the switch circuits 1 to 3 mentioned above between adjacent conductive pads, and comparing to a general programmable connection chip, the programmable connection chip C1 may have a lower on-state resistance and a wider channel bandwidth, and further have a higher signal transmit speed. It should be noted that the conductive array of the programmable connection chip C1 is not limited to a 2×2 array shown in FIG. 5, and may be an n×m conductive pad array, wherein each of n and m is any positive integer equal to or bigger than 2.

Please refer to FIG. 6, which is a schematic diagram illustrating a system package to which the programmable connection chip is applicable according to an embodiment of the present disclosure. As shown in FIG. 6, the system package A may include the programmable connection chip C1, a first chip C2, a second chip C3, an upper redistribution layer (RDL) A1, a through mold via (TMV) layer A2, a middle redistribution layer A3, a through silicon via layer A4, a lower redistribution layer A5 and a ball grid array (BGA) package formed of a plurality of solder balls, wherein the programmable connection chip C1 is disposed at the through mold via layer A2, the first chip C2 and the second chip C3 are disposed on the surface, opposite to the surface where the programmable connection chip C1 and the through mold via layer A2 are disposed, of the upper redistribution layer A1.

The first chip C2 and the second chip C3 may each have a plurality of solder balls as pins. The upper redistribution layer A1 may include a plurality of wiring routes not connected with each other. The programmable connection chip C1 includes the structure shown in FIG. 5. The through mold via layer includes a plurality of through mold vias TMV. The through silicon via layer includes a plurality of through silicon vias TSV. The pins of the first chip C2 and the pins of the second chip C3 may respectively connect to the conductive pads at different locations of the programmable connection chip C1 through the plurality of wiring routes of the upper redistribution layer A1. The signal switch(es) of the programmable connection chip C1 is controlled to conduct the conductive pads connected with the pins. The wiring routes are connected to the solder balls SB through the through mold vias TMV in the through mold via layer A2 and the through silicon vias TSV in the through silicon via layer A3°

The conductive paths shown in FIG. 6 are merely examples. The signal switches in the programmable connection chip C1 may be controlled to conduct different conductive paths between the conductive pads, and be accompanied with the upper redistribution layer A1 to provide other routing combinations. That is, a single wiring design accompanied with the connection chip may provide multiple routing combinations. Accordingly, for different types of chip system packages, there may be no need to design various redistribution layers with different wiring routes, thereby reducing research-and-development time and research- and—development cost of product. In addition, the numbers of chip pins, the numbers of wiring routings and the number of vias shown in FIG. 6 are exemplary, and not limited in the present disclosure.

Through the structure above, the switch circuit disclosed by the present disclosure may include a sub-circuit for dynamically tracing the voltage of the input signal to control the base voltage, and may have a lower on-state resistance comparing to the general transmission gate, and further reduce the charging time and discharging time of the transistor and increase the channel bandwidth by the structure mentioned above. Since the switch circuit disclosed by the present disclosure includes a circuit structure in which the two terminals are balanced, the resistance value of the switch circuit may remain the same no matter which direction the signal is transmitted. Moreover, in comparison with the general programmable connection chip, the programmable connection chip including the switch circuit mentioned above may have a lower on-state resistance and a wider channel bandwidth, and further have a higher signal transmit speed.

What is claimed is:

1. A switch circuit, comprising:
   a transmission gate having two input/output (I/O) terminals, two gate control terminals and two base control terminals, and is configured to make the two I/O terminals conduct or not conduct with each other according to voltages of the two gate control terminals;
   two base control sub-circuits, each comprising:
   a first transistor having a first terminal electrically connected to a first one of the two I/O terminals, a second terminal electrically connected to a first node, and a control terminal electrically connected to a second node; and
   a second transistor having a first terminal electrically connected to the first node, a second terminal electrically connected to a second one of the two I/O terminals, and a control terminal electrically connected to the second node;
   a third transistor having a first terminal electrically connected a first one of the two base control terminals, a second terminal which is grounded, and a control terminal electrically connected a first one of the two gate control terminals;

a fourth transistor having a first terminal configured to receive a working voltage, a second terminal electrically connected to a second one of the two base control sub-circuits, and a control terminal electrically connected to a second one of the two gate control terminals;

a fifth transistor having a first terminal of the fifth transistor electrically connected to the first terminal of the first transistor of a first one of the two base control sub-circuits, a second terminal electrically connected to the second terminal of the first transistor of the first one of the two base control sub-circuits, and a control terminal electrically connected to the control terminal of the first transistor of a second one of the two base control sub-circuits; and a sixth transistor having a first terminal of the sixth transistor electrically connected to the first terminal of the second transistor of the first one of the two base control sub-circuits, a second terminal electrically connected to the second terminal of the second transistor of the first one of the two base control sub-circuits, and a control terminal electrically connected to the control terminal of the second transistor of the second one of the two base control sub-circuits;

wherein the first node and the second node corresponding to one of the two base control sub-circuits are the first one of the two base control terminals and the second one of the two gate control terminals, respectively, and the first node and the second node of the other one of the two base control sub-circuits are the second one of the two base control terminals and the first one of the two gate control terminals, respectively.

2. The switch circuit of claim 1, further comprising:

a seventh transistor having a first terminal electrically connected to the first terminal of the first transistor of the second one of the two base control sub-circuits, a second terminal electrically connected to the second terminal of the first transistor of the second one of the two base control sub-circuits, and a control terminal electrically connected to the control terminal of the first transistor of the first one of the two base control sub-circuits; and an eighth transistor having a first terminal electrically connected to the first terminal of the second transistor of the second one of the two base control sub-circuits, a second terminal electrically connected to the second terminal of the second transistor of the second one of the two base control sub-circuits, and a control terminal electrically connected to the control terminal of the second transistor of the first one of the two base control sub-circuits.

3. A programmable connection chip, comprising:

a plurality of conductive pads arranged in a conductive pad array, wherein each of the plurality of conductive pads comprised in the conductive pad array has a row position and a column position in the conductive array, a row signal switch is provided between two adjacent conductive pads corresponding to the same row position, a column signal switch is provided between two adjacent conductive pads corresponding to the same column position, wherein at least one of the row signal switch and the column switch comprises the switch circuit of claim 1, and the two I/O terminals of the switch circuit are connected to the two adjacent conductive pads, respectively; and a switch control circuit electrically connected to the two gate control terminals of the switch circuit.

4. The programmable connection chip of claim 3, wherein the switch circuit further comprising:

a seventh transistor having a first terminal of the seventh transistor electrically connected to the first terminal of the first transistor of the second one of the two base control sub-circuits, a second terminal electrically connected to the second terminal of the first transistor of the second one of the two base control sub-circuits, and a control terminal electrically connected to the control terminal of the first transistor of the first one of the two base control sub-circuits; and an eighth transistor having a first terminal of the eighth transistor electrically connected to the first terminal of the second transistor of the second one of the two base control sub-circuits, a second terminal electrically connected to the second terminal of the second transistor of the second one of the two base control sub-circuits, and a control terminal electrically connected to the control terminal of the second transistor of the first one of the two base control sub-circuits.

* * * * *